United States Patent
Shimotsusa

(10) Patent No.: US 9,147,709 B2
(45) Date of Patent: Sep. 29, 2015

(54) SOLID-STATE IMAGE SENSOR AND CAMERA

(71) Applicant: CANON KABUSHIKI KAISHA, Tokyo (JP)

(72) Inventor: Mineo Shimotsusa, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 89 days.

(21) Appl. No.: 14/161,029

(22) Filed: Jan. 22, 2014

(65) Prior Publication Data

US 2014/0217538 A1 Aug. 7, 2014

(30) Foreign Application Priority Data

Feb. 4, 2013 (JP) ................................. 2013-019884

(51) Int. Cl.
| | |
|---|---|
| *H01L 31/0203* | (2014.01) |
| *H01L 21/00* | (2006.01) |
| *H01L 27/146* | (2006.01) |
| *H01L 25/16* | (2006.01) |
| *H01L 31/173* | (2006.01) |

(52) U.S. Cl.
CPC ........ *H01L 27/14627* (2013.01); *H01L 25/167* (2013.01); *H01L 27/1464* (2013.01); *H01L 27/14621* (2013.01); *H01L 27/14623* (2013.01); *H01L 27/14685* (2013.01); *H01L 31/173* (2013.01)

(58) Field of Classification Search
CPC ..................... H01L 27/14627; H01L 27/1464; H01L 27/14623; H01L 27/14621; H01L 27/14685; H01L 25/167; H01L 31/173
See application file for complete search history.

(56) References Cited

U.S. PATENT DOCUMENTS

| | | | |
|---|---|---|---|
| 7,411,170 | B2 | 8/2008 | Shimotsusa et al. |
| 7,592,578 | B2 | 9/2009 | Shimotsusa et al. |
| 7,935,557 | B2 | 5/2011 | Mishima et al. |
| 8,163,588 | B2 | 4/2012 | Mishima et al. |
| 8,269,299 | B2 | 9/2012 | Yokogawa |
| 8,274,122 | B2 | 9/2012 | Shimotsusa |
| 8,569,855 | B2 | 10/2013 | Yokogawa |
| 8,698,208 | B2 | 4/2014 | Mishima et al. |
| 8,711,258 | B2 | 4/2014 | Takase et al. |
| 8,802,478 | B2 * | 8/2014 | Kato et al. ...................... 438/59 |
| 2010/0295143 | A1 | 11/2010 | Yokogawa |
| 2011/0234868 | A1 | 9/2011 | Yamashita et al. |

(Continued)

FOREIGN PATENT DOCUMENTS

| | | |
|---|---|---|
| JP | 2010-271049 A | 12/2010 |
| JP | 2012-084815 A | 4/2012 |

(Continued)

*Primary Examiner* — Alonzo Chambliss

(74) *Attorney, Agent, or Firm* — Fitzpatrick, Cella, Harper & Scinto

(57) ABSTRACT

A solid-state image sensor includes a structure having a semiconductor layer in which a plurality of photoelectric converters are arranged, a light blocking member arranged above a face of the structure and including a plurality of circular openings each corresponding to at least one of the photoelectric converters, a first layer configured to cover the light blocking member, and exposed portions of the face of the structure, that are formed by the plurality of circular openings, and a second layer arranged to cover the first layer and having a refractive index higher than that of the first layer, wherein an interface between the first layer and the second layer includes lens faces protruding toward the exposed portions.

11 Claims, 5 Drawing Sheets

(56) References Cited

U.S. PATENT DOCUMENTS

| | | |
|---|---|---|
| 2012/0267745 A1 | 10/2012 | Tsuji |
| 2012/0268631 A1 | 10/2012 | Takase et al. |
| 2012/0292521 A1 | 11/2012 | Yokogawa |
| 2013/0020468 A1* | 1/2013 | Mitsuhashi et al. ........ 250/208.1 |
| 2013/0089947 A1* | 4/2013 | Kato et al. ...................... 438/98 |
| 2013/0222657 A1 | 8/2013 | Shimotsusa |
| 2014/0145288 A1* | 5/2014 | Hayashi ......................... 257/435 |
| 2014/0253767 A1* | 9/2014 | Kato et al. .................... 348/280 |

FOREIGN PATENT DOCUMENTS

| | | |
|---|---|---|
| JP | 2012-227476 A | 11/2012 |
| JP | 2012-227478 A | 11/2012 |

* cited by examiner

F I G. 5
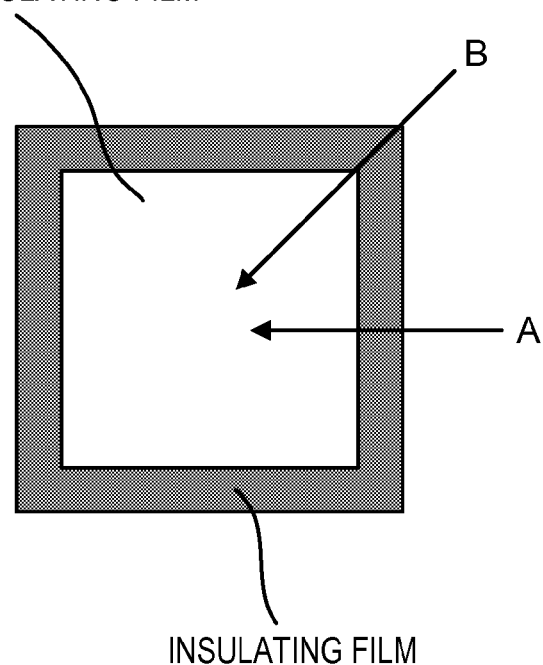

SOLID-STATE IMAGE SENSOR AND CAMERA

BACKGROUND OF THE INVENTION

1. Field of the Invention

The present invention relates to a solid-state image sensor and a camera including it.

2. Description of the Related Art

In a solid-state image sensor disclosed in Japanese Patent Laid-Open No. 2012-84815, protruded portions made of a light reflecting member are arranged at boundary portions between adjacent pixels on a semiconductor substrate in order to reduce mixture of colors, and an insulating film is formed to cover the protruded portions. In the insulating film, steps generated by the protruded portions are reflected to form concave lenses. The concave lens can condense incident light to a photoelectric converter. The protruded portions have a lattice shape in which rectangular openings are two-dimensionally arrayed.

In the solid-state image sensor disclosed in Japanese Patent Laid-Open No. 2012-84815, the concave lens formed by the insulating film has a shape conforming to the rectangular opening at the protruded portion. The concave lens may actually have a shape in which a truncated pyramid-like hole is formed in the insulating film. For this reason, the light collection effect may change depending on the incident direction of a beam to the concave lens. For example, in FIG. 5, a light collection effect obtained when a beam enters the concave lens parallel to the side of the rectangular opening, as indicated by an arrow A, differs from a light collection effect obtained when a beam enters the concave lens in the diagonal direction of the rectangular opening, as indicated by an arrow B. This may cause nonuniformity of sensitivity in the image sensing region and nonuniformity of the effect of reducing mixture of colors.

SUMMARY OF THE INVENTION

The present invention provides a technique advantageous for reducing nonuniformity of sensitivity in the image sensing region and/or nonuniformity of the effect of reducing mixture of colors.

One of aspects of the present invention provides a solid-state image sensor including a structure having a semiconductor layer in which a plurality of photoelectric converters are arranged, comprising: a light blocking member arranged above a face of the structure and including a plurality of circular openings each corresponding to at least one of the photoelectric converters; a first layer configured to cover the light blocking member, and exposed portions of the face of the structure, formed by the plurality of circular openings; and a second layer arranged to cover the first layer and having a refractive index higher than that of the first layer, wherein an interface between the first layer and the second layer includes lens faces protruding toward the exposed portions.

Further features of the present invention will become apparent from the following description of exemplary embodiments with reference to the attached drawings.

BRIEF DESCRIPTION OF THE DRAWINGS

FIG. 5 is a view for explaining the action of a concave lens disclosed in Japanese Patent Laid-Open No. 2012-84815.

DESCRIPTION OF THE EMBODIMENTS

An exemplary embodiment of the present invention will now be described with reference to the accompanying drawings.

Figure 1:
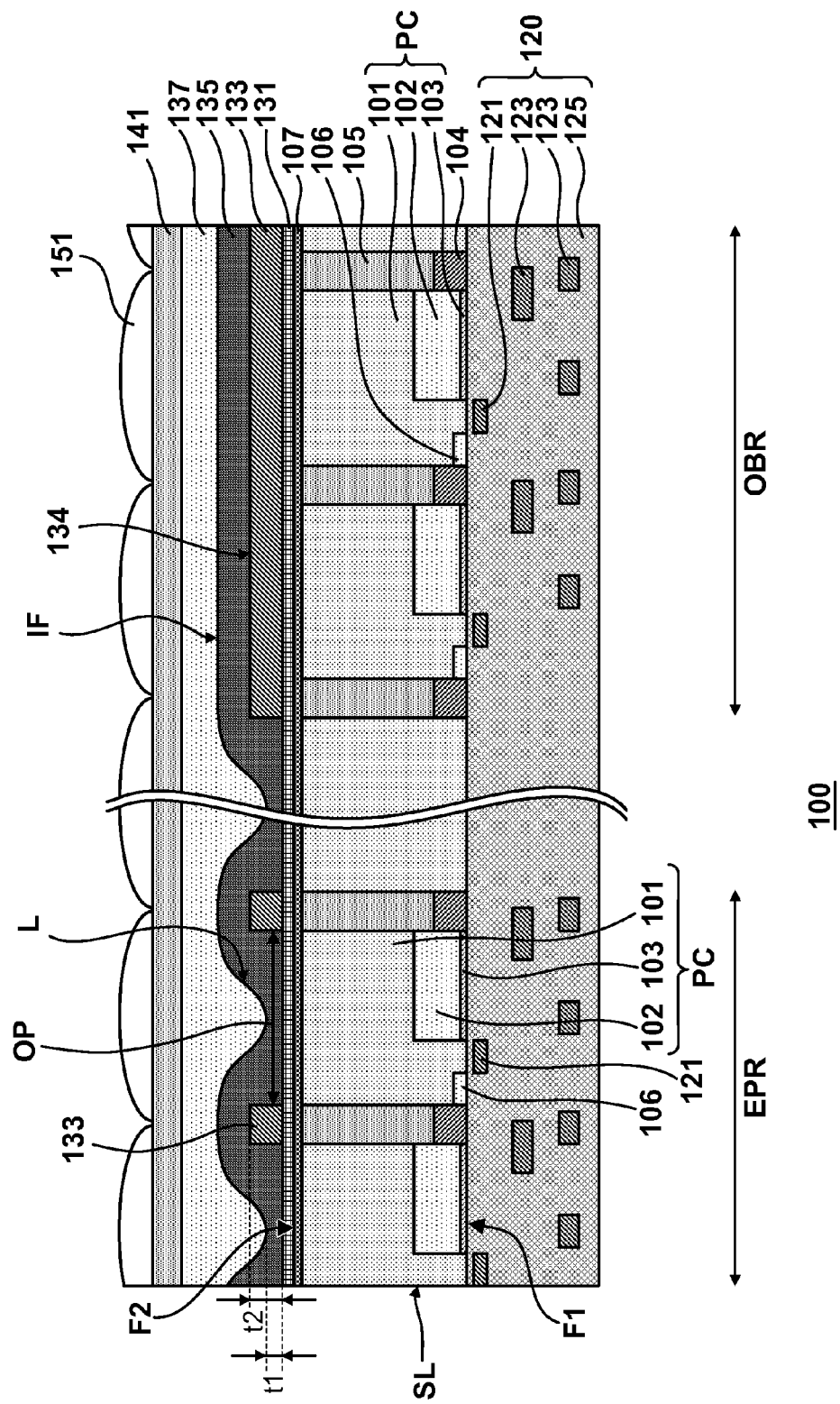
FIG. 1 is a schematic view showing the sectional structure of a solid-state image sensor according to one embodiment of the present invention.

FIG. 1 schematically shows the sectional structure of a solid-state image sensor 100 according to one embodiment of the present invention. The solid-state image sensor 100 can include a semiconductor layer SL having a first face F1 and second face F2, a plurality of photoelectric converters PC two-dimensionally arranged in the semiconductor layer SL, and a wiring structure 120 arranged above the side of the first face F1.

Each photoelectric converter PC can include a semiconductor region 101 of the first conductivity type arranged in the semiconductor layer SL, and a charge accumulation region 102 of the first conductivity type arranged in the semiconductor layer SL so as to contact the semiconductor region 101. The impurity concentration of the first conductivity type in the charge accumulation region 102 is higher than that of the first conductivity type in the semiconductor region 101. The photoelectric converter PC may include a pinning layer 103 of the second conductivity type arranged on the side of the first face F1 in the semiconductor layer SL so as to contact the charge accumulation region 102. The photoelectric converter PC may include a pinning layer 107 of the second conductivity type arranged on the side of the second face F2 in the semiconductor layer SL so as to contact the semiconductor region 101. The first and second conductivity types are opposite to each other. When the first conductivity type is an n type, the second conductivity type is a p type. When the first conductivity type is a p type, the second conductivity type is an n type. The region where the plurality of photoelectric converters PC are arranged typically includes an effective pixel region (image sensing region) EPR and optical black pixel region OBR.

The solid-state image sensor 100 includes a plurality of pixels, and each pixel includes the photoelectric converter PC. Each pixel can further include a floating diffusion 106, and a transfer gate 121 which forms a channel for transferring charges accumulated in the charge accumulation region 102 of the photoelectric converter PC to the floating diffusion 106. An insulator 104 for element isolation and a semiconductor region 105 of the second conductivity type can be arranged between pixels.

The solid-state image sensor 100 is configured so that light traveling from an object enters the second face F2 via an imaging lens. That is, the solid-state image sensor 100 is configured to be of the back-side illumination type in which the wiring structure 120 is arranged above the first face side (F1 side) of the semiconductor layer SL and light traveling from an object enters the second face F2 of the semiconductor layer SL. On the second face side (F2 side), a plurality of microlenses 151 can be typically arranged. When the solid-state image sensor 100 is configured to sense a color image, a color filter layer 141 can be arranged above the side of the second face F2.

Figure 2:
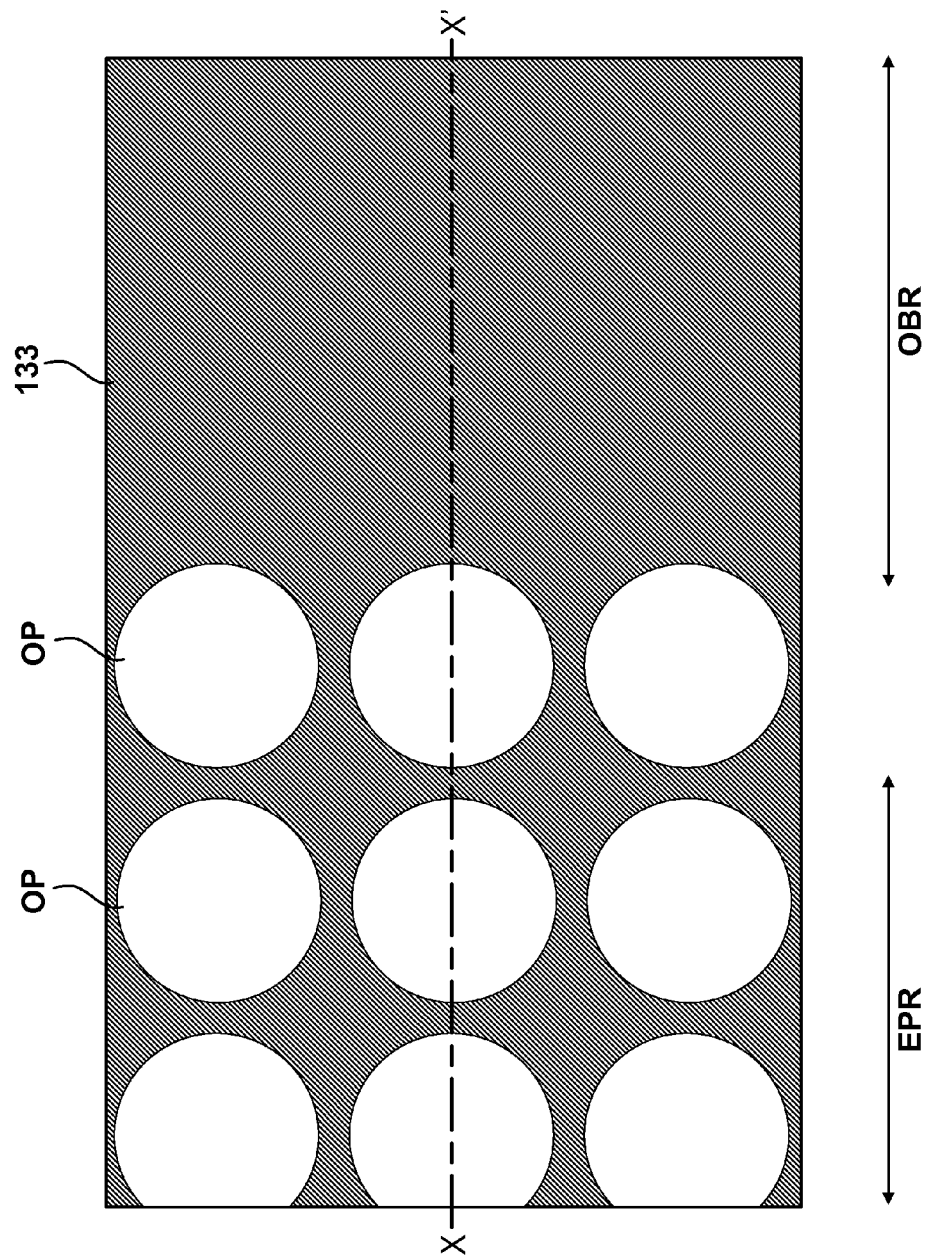
FIG. 2 is a view exemplifying a plurality of circular openings formed in a light blocking member.

A light blocking member 133, first layer 135, and second layer 137 are arranged between the second face F2 of the semiconductor layer SL and the microlenses 151. The light blocking member 133 is arranged above the second face (on F2) and has a plurality of circular openings OP. Each circular opening OP corresponds to at least one photoelectric converter PC. In general, one circular opening OP corresponds to one photoelectric converter PC. However, for example, when the solid-state image sensor 100 is configured as a solid-state image sensor having a phase-difference detection function, one circular opening OP corresponds to two photoelectric converters PC. FIG. 2 exemplifies a plurality of circular openings OP formed in the light blocking member 133. The sectional view of FIG. 1 corresponds to a section taken along a line X-X' in FIG. 2.

The first layer 135 is arranged to cover the light blocking member 133, and exposed portions of the second face F2 of the semiconductor layer SL that are formed or exposed by the plurality of circular openings OP. In a case where the solid-state image sensor 10 includes a transparent film, such as interlayer insulating layer 131, arranged between the second face F2 of the semiconductor layer SL, and the light blocking member 133 and first layer 135, the exposed portions of the second face F2 of the semiconductor layer SL are exposed by the plurality of circular openings OP via the transparent film. In other words, the first layer 135 is arranged to cover the light blocking member 133, and exposed portions of a face of a structure that includes the semiconductor layer SL, and an optional transparent film such as the interlayer insulating film 131, wherein the exposed portions are exposed by the plurality of circular openings OP. The second layer 137 is arranged to cover the first layer 135, and is higher in refractive index than the first layer 135. The second layer 137 also functions as a planarizing film. An interface IF between the first layer 135 and the second layer 137 includes lens faces L protruding toward the exposed portions of the second face F2 that are formed or exposed by the plurality of circular openings OP. Each lens face L functions as a convex lens and converges light to at least one corresponding photoelectric converter PC. The lens face L functions as an intra-layer lens. By forming the lens face L, light having passed through the microlens 151 of a given pixel can be prevented from entering the photoelectric converter PC of an adjacent pixel, reducing mixture of colors.

The presence of the circular openings OP in the light blocking member 133 forms a concavo-convex shape having continuous rotation symmetry by the exposed portions of the second face F2 of the semiconductor layer SL and the light blocking member 133. The lens faces L also have a shape conforming to the concavo-convex shape, that is, a shape having continuous rotation symmetry. Thus, the light collection efficiency does not depend on the direction of a beam entering the lens face L (this direction is the direction of a beam two-dimensionally viewed when the solid-state image sensor 100 is observed from a direction perpendicular to the second face F2). Nonuniformity of sensitivity in the effective pixel region (image sensing region) EPR and/or nonuniformity of the effect of reducing mixture of colors can therefore be reduced.

A thickness t1 of the first layer 135 at a portion of the lens face L that protrudes most toward the exposed portion of the second face F2 is preferably smaller than a thickness t2 of the light blocking member 133. That is, a portion of the lens face L that protrudes most toward the exposed portion of the second face F2 is closer to the second face F2, compared to an upper face 134 of the light blocking member. This contributes to increasing the power of the lens face L.

When the solid-state image sensor 100 includes the optical black pixel region OBR, the light blocking member 133 can be arranged to block, from light, the photoelectric converters PC arranged in the optical black pixel region OBR. In the optical black pixel region OBR, no incident light need be detected, and the problem of mixture of colors does not occur, so the lens face L for preventing mixture of colors need not be formed. Hence, the light blocking member 133 is arranged to form the lens faces L in the effective pixel region EPR and is arranged to block, from the light, the photoelectric converters PC in the optical black pixel region OBR. This arrangement contributes to simplification of the structure of the solid-state image sensor 100.

The first layer 135 and second layer 137 are preferably made of an inorganic material, but may be made of an organic material. The first layer 135 can be made of, for example, silicon oxide or silicon oxynitride. The second layer 137 can be made of, for example, a material higher in refractive index than the first layer 135 among materials selected from the group consisting of silicon oxynitride, silicon nitride, hafnium oxide, and titanium oxide.

The first layer 135 can be formed by forming a silicon oxide film to cover the second face F2 of the semiconductor layer SL on which the light blocking member 133 is formed, applying a silicon-containing solution onto the silicon oxide film, and heating it to change it into a silicon oxide film. After that, if necessary, the silicon oxide film on the face may be etched back to adjust the level of the upper face of the silicon film. In this example, the second layer 137 can be formed by depositing a silicon nitride film on the silicon oxide film serving as the first layer 135, and planarizing the face of the silicon nitride film by CMP or the like. Note that the above-described materials and forming methods of the first layer 135 and second layer 137 are merely an example and do not limit the present invention.

Figure 3:
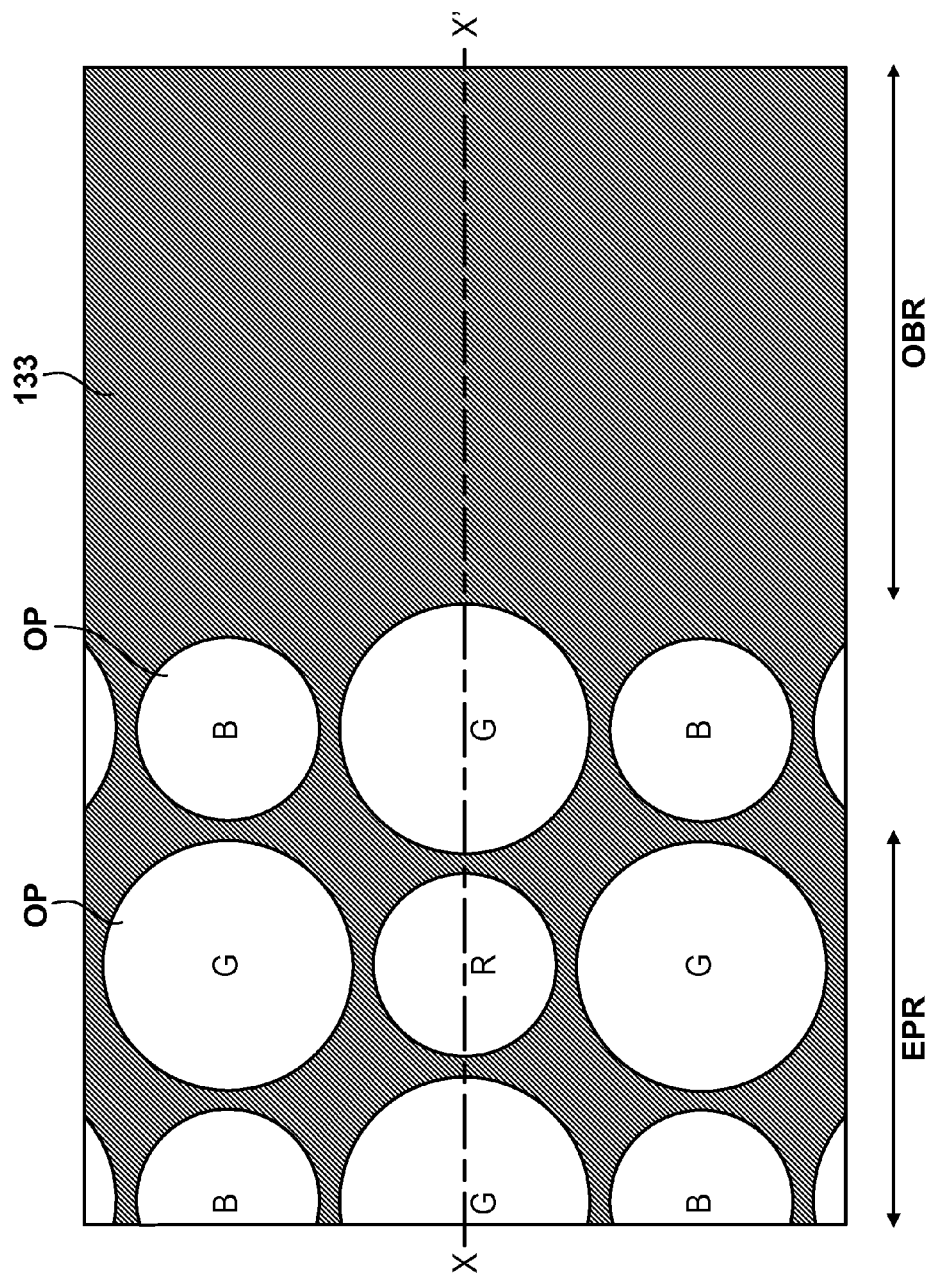
FIG. 3 is a view exemplifying a plurality of circular openings formed in a light blocking member.

When the solid-state image sensor 100 includes the color filter layer 141, each of the plurality of openings OP formed in the light blocking member 133 may be decided to have a size complying with a color of the color filter corresponding to the opening OP, as exemplified in FIG. 3. The color filter layer 141 includes a plurality of color filters. In FIG. 3, R, G, and B mean that red, green, and blue colors (color filters) in a Bayer array are assigned. The sizes of the respective openings OP can be decided so that the ratio of the red, green, and blue sensitivities has a target value. Similarly, each of the plurality of microlenses 151 may be decided to have a size complying with a color corresponding to the microlens 151. To increase the green sensitivity, the area of an opening for green is set to be larger than those of openings for red and blue. However, these areas can be changed in accordance with an application purpose.

An interlayer insulating layer 131 functioning as an anti-reflection film can be arranged between the second face F2 of the semiconductor layer SL, and the light blocking member 133 and first layer 135. The color filter layer 141 is typically arranged above the second layer 137. The wiring structure 120 can include, for example, gate electrodes including the transfer gates 121, a wiring pattern 123, an interlayer insulating film 125, and contact plugs and via plugs (none are shown).

Figure 4:
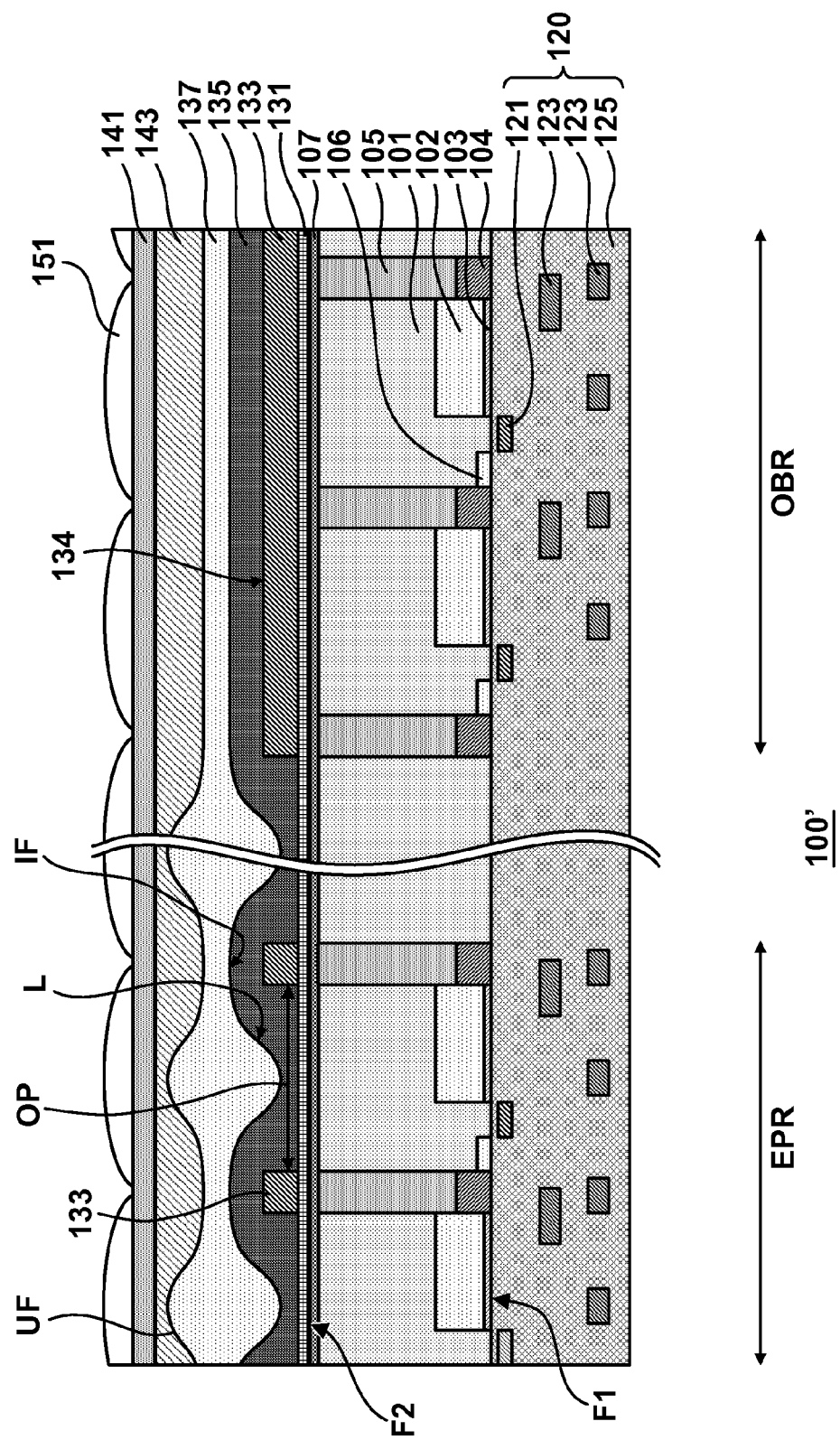
FIG. 4 is a schematic view showing the sectional structure of a solid-state image sensor according to another embodiment of the present invention.

FIG. 4 shows a modification of the solid-state image sensor 100 shown in FIG. 1. In a solid-state image sensor 100' according to the modification, an upper face UF of the second layer has a plurality of convex face regions so that a plurality of double-convex lenses are constructed by the second layer 137. A planarizing layer 143 is arranged above the second layer. The refractive index of the planarizing layer 143 is lower than that of the second layer 137.

The second layer 137 can be formed by, for example, the following method. First, a silicon nitride film is formed on the first layer 135 formed from a silicon oxide film. Then, a photoresist film is formed on the silicon nitride film, and an island-like photoresist pattern is formed on each lens face L by exposure and development steps. Heat is applied to the photoresist pattern to form the photoresist pattern into a hemispherical shape. Thereafter, the photoresist pattern and silicon nitride film are etched to transfer the hemispherical shape of the photoresist pattern to the underlying silicon nitride film. As a result, the second layer 137 having a plurality of convex face regions is formed on the upper face UF.

Although the above-described solid-state image sensor 100 is constituted to be of the back-side illumination type, the present invention is applied not only to the back-side illumination type but also to the front-side illumination type. In the front-side illumination solid-state image sensor, light enters a semiconductor layer through the gap of a light blocking member (for example, wiring pattern) in a wiring structure. That is, the back-side illumination solid-state image sensor has a wiring structure on a face opposite to the face of the semiconductor layer, while the front-side illumination solid-state image sensor has a wiring structure on the face of the semiconductor layer. When the solid-state image sensor 100 is constructed to be of the front-side illumination type, the wiring structure 120 can be arranged between the light blocking member 133 and the second face F2 or between the second layer 137 and the color filter layer 141.

As an application of the solid-state image sensor according to the embodiment, a camera in which the solid-state image sensor is assembled will be exemplarily explained. The concept of the camera includes not only an apparatus mainly aiming at image capturing but also an apparatus (for example, a personal computer or portable terminal) accessorily having an image capturing function. The camera includes the solid-state image sensor according to the present invention exemplified as the embodiment, and a processing unit which processes a signal output from the solid-state image sensor. The processing unit can include, for example, an A/D converter and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-019884, filed Feb. 4, 2013, which is hereby incorporated by reference herein in its entirety.

What is claimed is:

1. A solid-state image sensor including a structure having a semiconductor layer in which a plurality of photoelectric converters are arranged, comprising:

a light blocking member arranged above a face of the structure and including a plurality of circular openings each corresponding to at least one of the photoelectric converters;

a first layer configured to cover the light blocking member, and exposed portions of the face of the structure, formed by the plurality of circular openings; and a second layer arranged to cover the first layer and having a refractive index higher than that of the first layer, wherein an interface between the first layer and the second layer includes lens faces protruding toward the exposed portions.

2. The sensor according to claim 1, wherein a thickness of the first layer at a portion of the lens face that protrudes most toward the exposed portion is smaller than a thickness of the light blocking member.

3. The sensor according to claim 1, wherein the first layer and the second layer are formed from an inorganic material.

4. The sensor according to claim 3, wherein
the first layer is formed from one of silicon oxide and silicon oxynitride, and
the second layer is formed from a material having a refractive index higher than that of the first layer among materials selected from the group consisting of silicon oxynitride, silicon nitride, hafnium oxide, and titanium oxide.

5. The sensor according to claim 1, further comprising a color filter layer arranged above the second layer and including a plurality of color filters,
wherein each of the plurality of openings has a size complying with a color of the color filter corresponding to the opening.

6. The sensor according to claim 5, further comprising a plurality of microlenses arranged above the color filter layer,
wherein each of the plurality of microlenses has a size complying with a color corresponding to the microlens.

7. The sensor according to claim 1, wherein
a region where the plurality of photoelectric converters are arranged includes an effective pixel region and an optical black pixel region, and
the light blocking member is arranged to block, from light, the photoelectric converters arranged in the optical black pixel region.

8. The sensor according to claim 1, wherein an upper face of the second layer includes a plurality of convex face regions to form a plurality of double-convex lenses by the second layer.

9. The sensor according to claim 1, wherein the solid-state image sensor has a wiring structure arranged above the face of the structure.

10. The sensor according to claim 1, wherein the solid-state image sensor has a wiring structure arranged at a side opposite to the face of the structure.

11. A camera comprising:
a solid-state image sensor defined in claim 1; and
a processing unit configured to process a signal output from the solid-state image sensor.

* * * * *